(12) United States Patent
Jang (10) Patent No.: US 8,942,339 B2
(45) Date of Patent: *Jan. 27, 2015

(54) SHIFT REGISTER

(71) Applicant: LG Display Co., Ltd., Seoul (KR)

(72) Inventor: Yong Ho Jang, Seongnam-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/034,150

(22) Filed: Sep. 23, 2013

(65) Prior Publication Data

US 2014/0023174 A1 Jan. 23, 2014

Related U.S. Application Data

(62) Division of application No. 11/966,684, filed on Dec. 28, 2007, now Pat. No. 8,014,488, and a division of application No. 13/187,984, filed on Jul. 21, 2011, now Pat. No. 8,265,222, and a division of application No. 13/590,986, filed on Aug. 21, 2012, now Pat. No. 8,553,830.

(30) Foreign Application Priority Data

Mar. 12, 2007 (JP) .......................... 10-2007-0023835

(51) Int. Cl.
*G11C 19/00* (2006.01)
*G11C 19/28* (2006.01)

(52) U.S. Cl.
CPC ............... *G11C 19/00* (2013.01); *G11C 19/28* (2013.01)
USPC .................... 377/64; 377/69; 377/78; 377/79

(58) Field of Classification Search
None
See application file for complete search history.

(56) References Cited

U.S. PATENT DOCUMENTS

| 5,859,630 | A | 1/1999 | Huq |
| 6,611,248 | B2 | 8/2003 | Kanabara et al. |
| 7,443,943 | B2 | 10/2008 | Kim et al. |
| 7,529,333 | B2 | 5/2009 | Kim et al. |
| 7,880,714 | B2 | 2/2011 | Jang et al. |
| 8,040,313 | B2 | 10/2011 | Jang |
| 2005/0212746 | A1 | 9/2005 | Iwasaki et al. |

(Continued)

FOREIGN PATENT DOCUMENTS

EP 0404025 12/1990

OTHER PUBLICATIONS

Extended Search Report issued in corresponding European Patent Application No. 07123208.6; dated Jun. 23, 2008.

(Continued)

*Primary Examiner* — Tuan T Lam
(74) *Attorney, Agent, or Firm* — Brinks Gilson & Lione (57) ABSTRACT

A shift register is disclosed, which can prevent malfunctioning of device by decreasing the load on a discharging voltage source line, and can decrease a size of stage. The shift register comprises a plurality of stages to sequentially output scan pulses through respective output terminals, wherein each of the stages comprises a pull-up switching unit controlled based on a signal state of node, and connected between the output terminal and any one among a plurality of clock transmission lines to transmit the clock pulses provided with sequential phase differences; and a node controller to control the signal state of node, and to discharge the node by using the clock pulse from any one among the plurality of clock transmission line.

6 Claims, 10 Drawing Sheets

(56) References Cited

U.S. PATENT DOCUMENTS

| | | |
|---|---|---|
| 2006/0213124 A1 | 9/2006 | Maruchi |
| 2006/0291610 A1* | 12/2006 | Lo et al. .................. 377/64 |
| 2007/0127620 A1 | 6/2007 | Moon et al. |
| 2007/0297559 A1 | 12/2007 | Cho et al. |
| 2010/0150301 A1* | 6/2010 | Chan et al. .................. 377/64 |

OTHER PUBLICATIONS

Office Action issued in corresponding Chinese Patent Application No. 2007103083519; issued Nov. 20, 2009.

* cited by examiner

SHIFT REGISTER

The present invention document claims the benefit of priority to and is a divisional of U.S. patent application Ser. No. 13/590,986 filed Aug. 21, 2012, which is a divisional of Ser. No. 13/187,984 (Now U.S. Pat. No. 8,265,222), filed Jul. 21, 2011, which is a divisional of U.S. Pat. No. 8,041,488 filed Dec. 28, 2007, which claims priority to Korean Patent Application No. 10-2007-0023835 filed in Korea on Mar. 12, 2007, the entirety of which are hereby incorporated by reference herein.

BACKGROUND

1. Field of the Invention

The present invention relates to a shift register of a liquid crystal display (LCD) device, and more particularly, to a shift register which can prevent malfunctioning of device by decreasing load on a discharging voltage source line and can decrease a size of stage.

2. Discussion of the Related Art

In general, a liquid crystal display (LCD) device displays images by controlling light transmittance of liquid crystal with the use of an electric field applied. For this, the LCD device is provided with a liquid crystal panel including a plurality of pixel regions arranged in a matrix configuration, and a driving circuit for driving the liquid crystal panel.

The liquid crystal panel comprises a plurality of gate lines and a plurality of data lines, wherein each gate line is formed orthogonal to each data line, to thereby define a plurality of pixel regions. In addition, the liquid crystal panel includes pixel electrodes and a common electrode to apply the electric field to the pixel regions, respectively. At this time, the gate lines are driven in response to a scan pulse generated from a shift register, in sequence.

Figure 1:
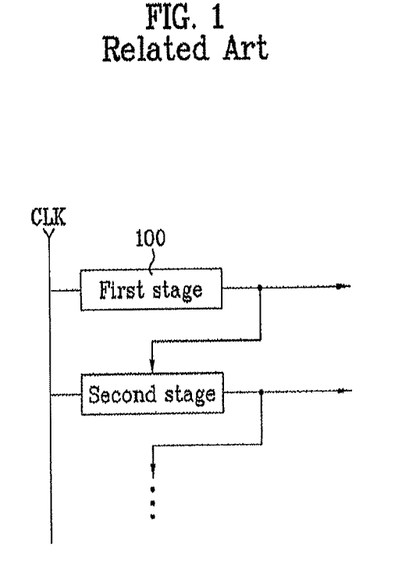
FIG. 1 is a diagram illustrating one stage included in a related art shift register.

FIG. 1 is a diagram illustrating one stage in a related art shift register. As shown in FIG. 1, the related art shift register includes a plurality of stages 100. The stages 100 are cascaded. Each stage is supplied with a clock pulse from a clock transmission line, and outputs the scan pulse in sequence. Each stage includes a plurality of nodes; a node controller to control a signal state of the node; and an output unit, connected to the node, to output the scan pulse in response to the signal state of the node. In order to maintain the node as a discharging state, the related art shift register uses a discharging voltage source corresponding to a constant voltage.

However, the related art shift register has the following disadvantages.

When the discharging voltage source is supplied to the node controller and output unit included in each stage, there is large load on a discharging voltage source line for transmitting the discharging voltage source. The related art shift register has may malfunction since the node included in each stage is not discharged properly.

Also, the related art stage is provided with at least two nodes and a plurality of switching devices to control the nodes, so that the shift register is increased in size. This large size of shift register may cause the limitation on technology of forming the shift register in the liquid crystal panel.

BRIEF SUMMARY

A shift register comprises a plurality of stages to sequentially output scan pulses through respective output terminals. Each of the stages comprises a pull-up switching unit controlled based on a signal state of node, and connected between the output terminal and any one among a plurality of clock transmission lines to transmit the clock pulses provided with sequential phase differences. A node controller controls the signal state of node, and discharges the node by using the clock pulse from any one among the plurality of clock transmission line.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE DRAWINGS AND THE PRESENTLY PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Hereinafter, a shift register according to the preferred embodiments of the present disclosure will be described with reference to the accompanying drawings.

Figure 2:
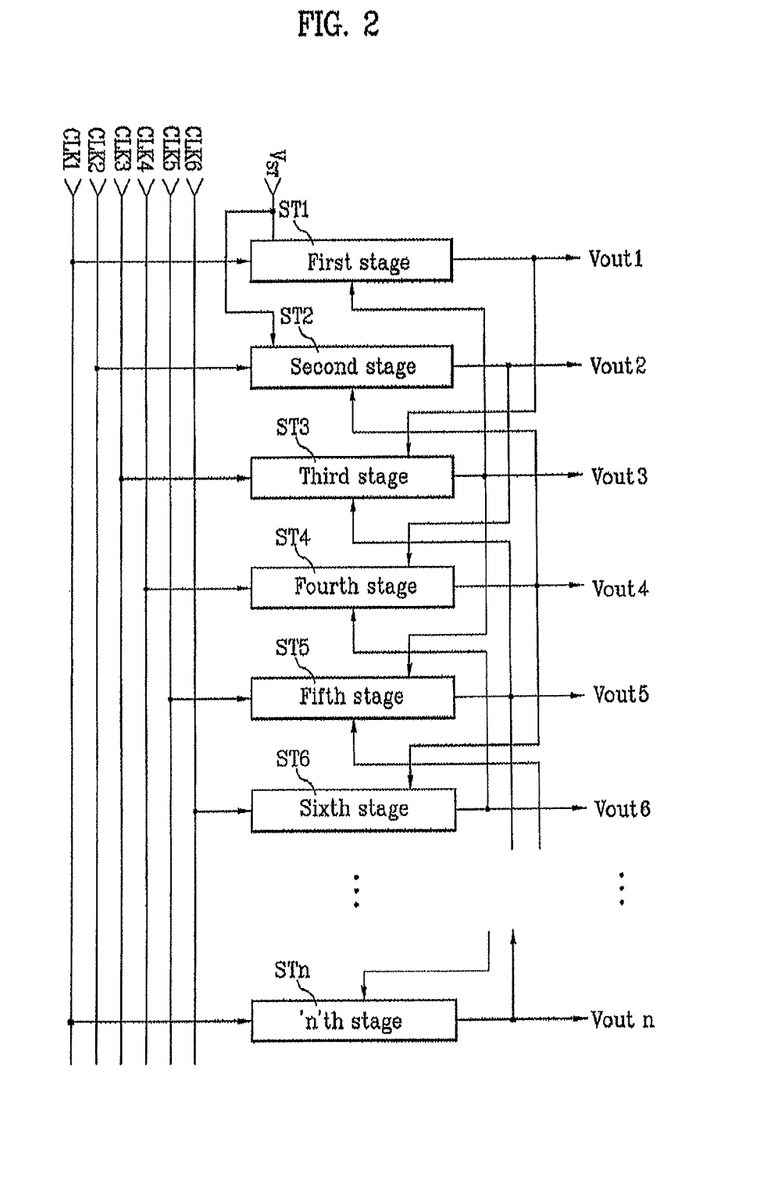
FIG. 2 is a diagram illustrating a shift register according to the preferred embodiment of the present disclosure.

As shown in FIG. 2, a shift register according to the preferred embodiment of the present disclosure includes 'n' stages ST1 to STn and a dummy stages (not shown). Each of the stages ST1 to STn outputs a scan pulse Vout1 to Voutn for one frame period, wherein the scan pulses are sequentially output from the first stage ST1 to the dummy stages.

The scan pulses Vout1 to Voutn output from the respective stages ST1 to STn except the dummy stages are sequentially supplied to gate lines included in a liquid crystal panel (not shown), thereby scanning the gate lines in sequence. Sequentially, the first stage ST1 outputs the first scan pulse Vout1, the second stage ST2 outputs the second scan pulse Vout2, the third stage ST3 outputs the third scan pulse Vout3, . . . , the 'n'th stage STn outputs the 'n'th scan pulse Voutn finally.

After the 'n'th stage STn outputs the 'n'th scan pulse Voutn, first and second dummy stages output the scan pulses. Then, the scan pulse output from the first dummy stage is supplied to the 'n−1'th stage. Also, the scan pulse output from the second dummy stage is supplied to the 'n'th stage STn. This shift register is formed in the liquid crystal panel. That is, the liquid crystal panel includes a display area to display images, and a non-display area surroundings the display area. The shift register is formed in the non-display area.

All stages ST1 to STn and dummy stages included in the shift register are supplied with a charging voltage source VDD, a discharging voltage source VSS and a plurality of clock pulses provided with sequential phase differences. The charging voltage source VDD and the discharging voltage source VSS correspond to D.C. voltages sources, wherein the charging voltage source VDD has a positive polarity, and the discharging voltage source VSS has a negative polarity. The discharging voltage source VSS may be a grounded voltage.

The clock pulses may use two or more clock pulses. The shift register according to the present invention uses the six clock pulses, that is, first to sixth clock pulses CLK1 to CLK6. The first to sixth clock pulses CLK1 to CLK6 are output with the sequential phase differences. The sequential output from the first to sixth clock pulses CLK1 to CLK6 is performed repeatedly. That is, after completing the sequential output from the first clock pulse CLK1 to the sixth clock pulse CLK6, the first to sixth clock pulses CLK1 to CLK6 are sequentially output again.

Based on the circuit structure of the stage, the number of clock pulses supplied to one stage may be variable. Among the stages ST1 to STn+1, the first stage ST1 positioned uppermost is supplied with a start pulse Vst as well as the charging voltage source VDD, the discharging voltage source VSS, and the first to sixth clock pulses CLK1 to CLK6. For one frame period, the clock pulses CLK1 to CLK6 are output several times. However, the start pulse Vst is output once for one frame period. In other words, the respective clock pulses CLK1 to CLK6 periodically represent the active state (high state) several times for one frame period, but the start pulse Vst represents the active state once for one frame period. At this time, the sixth clock pulse CLK6 may be output in synchronization with the start pulse Vst. Among the first to sixth clock pulses CLK1 to CLK6, the sixth clock pulse CLK6 is output firstly.

Figure 3:
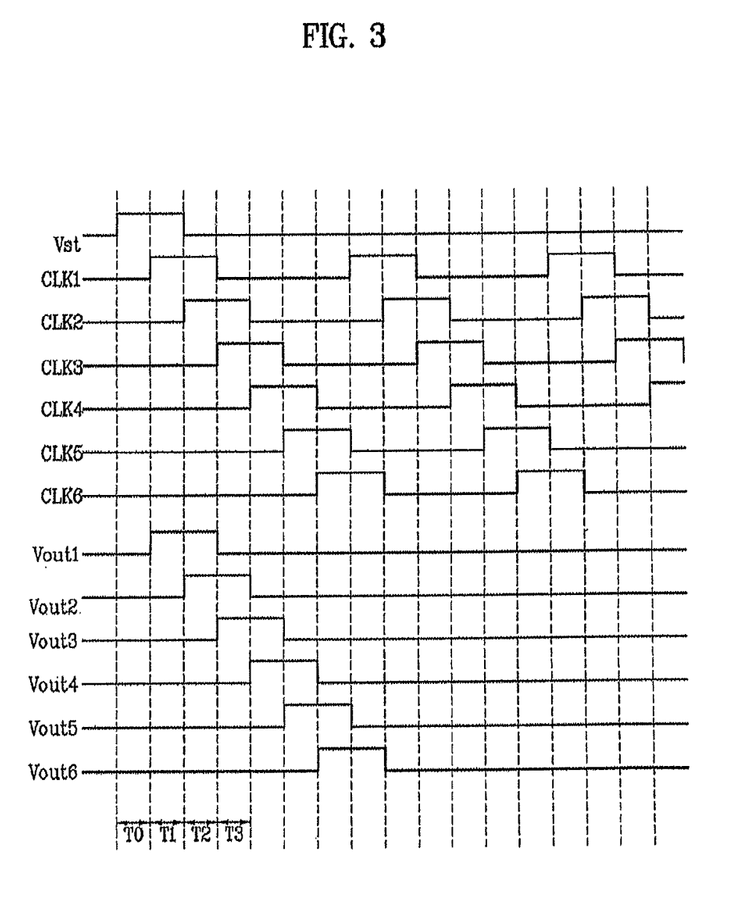
FIG. 3 is a timing diagram illustrating various signals supplied to or output from each stage of FIG. 2.

As shown in FIG. 3, the start pulse Vst and the first to sixth clock pulses CLK1 to CLK6 may have the high states which are partially overlapped for a predetermined period at the same time. Although not shown, it is possible to output the start pulse and the first to sixth clock pulses CLK1 to CLK6 without being overlapped to one another.

To make each of the stages ST1 to STn output the scan pulse, it is necessary to precede an enable operation for each of the stages ST1 to STn. Enabling the stage, that is, being the stage of output-enable state corresponds to the state of that the stage is set to output the clock pulse supplied thereto as the scan pulse. For this, each of the stages ST1 to STn is supplied with the scan pulse from the previous stage thereof, whereby each of the stages ST1 to STn is enabled. For example, the 'k'th stage is enabled in response to the scan pulse from the 'k−2'th stage.

There is no stage being positioned one row ahead of the first stage ST1 positioned uppermost, and two rows ahead of the second stage ST2. The first and second stages ST1 and ST2 are enabled in response to the start pulse Vst from a timing controller. Also, each of the stages ST1 to STn is disabled in response to the scan pulse from the next stage thereof. Disabling the stage, that is, being the stage of output-disable state corresponds to the state of that the stage is reset not to output the clock pulse supplied thereto as the scan pulse. For example, the 'k'th stage is disabled in response to the scan pulse from the 'k+2'th stage.

The detailed explanation for each of the stages ST1 to STn included in the shift register according to the present disclosure will be described as follows.

Figure 4:
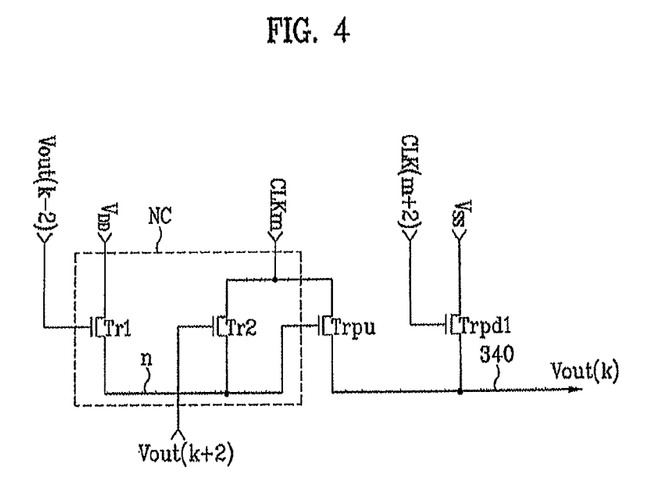
FIG. 4 is a diagram illustrating a first circuit structure of stage of FIG. 2.

FIG. 4 is a diagram illustrating a first circuit structure of stage of FIG. 2. As shown in FIG. 4, each of the stages ST1 to STn and dummy stages is comprised of a node n, a node controller NC, a pull-up switch Trpu, and a first pull-down switch Trpd1.

The node controller NC controls a signal state of the node n. That is, the node controller NC makes the node n charged or discharged. Especially, the node controller NC uses the clock pulse instead of the discharging voltage source VSS when the node controller NC makes the node N discharged.

The pull-up switch Trpu is turned-on when the node n is charged. After that, when the pull-up switch Trpu is turned-on, the pull-up switch Trpu outputs the clock pulse supplied thereto. The clock pulse output from the turned-on pull-up switch Trpu corresponds to the scan pulse. The pull-up switch Trpu included in the stages ST1 to STn and dummy stages outputs the scan pulse in response to the charging voltage source VDD charged in the node n, and supplies the scan pulse to the corresponding gate line, the next stage and the previous stage through an output terminal 340.

In more detail, the pull-up switch Trpu included in the 'k'th stage outputs the scan pulse in response to the charging voltage source VDD charged in the node of the 'k'th stage, and supplies the scan pulse to the 'k'th gate line, the 'k+2'th stage and the 'k−2'th stage. For this, a gate terminal of the pull-up switch Trpu is connected to the node n; a drain terminal thereof is connected to a clock transmission line; and a source terminal thereof is connected to the output terminal 340 of the 'k'th stage. At this time, the output terminal 340 of the 'k'th stage is connected to the 'k'th gate line, the 'k+2'th stage and the 'k−2'th stage. For example, the pull-up switch Trpu included in the third stage ST3 outputs the third clock pulse CLK3 as the third scan pulse Vout3, and supplies the third clock pulse CLK3 to the third gate line, the fifth stage ST5 and the first stage ST1.

In response to the clock pulse, the first pull-down switch Trpd1 is turned-on. Then, the first pull-down switch Trpd1 being turned-on outputs the discharging voltage source VSS supplied thereto. The first pull-down switch Trpd1 included in each of the stages ST1 to STn and dummy stages outputs the discharging voltage source VSS in response to the clock pulse, and supplies the discharging voltage source VSS to the corresponding gate line, the previous stage and the next stage.

In more detail, the first pull-down switch Trpd1 included in the 'k'th stage outputs the discharging voltage source VSS in response to the clock pulse, and supplies the discharging voltage source VSS to the 'k'th gate line, the 'k+2'th stage and the 'k−2'th stage. For this, the first pull-down switch Trpd1 has a gate terminal connected to a clock transmission line, a source terminal connected to a discharging voltage source transmission line, and a drain terminal connected to the output terminal 340 of the 'k'th stage. At this time, the output terminal 340 of the 'k'th stage is connected to the 'k'th gate line, the 'k+2'th stage and the 'k−2'th stage. For example, the first pull-down switch Trpd1 included in the third stage ST3 outputs the discharging voltage source VSS in response to the fifth clock pulse CLK5, and supplies the discharging voltage source VSS to the third gate line GL3, the fifth stage ST5 and the first stage ST1. The gate line is charged by the scan pulse output from the pull-up switch Trpu, and is discharged by the discharging voltage source VSS output from the first pull-down switch Trpd1.

The detailed structure for the node controller NC will be explained as follows. The node controller NC includes first and second switching units Tr1 and Tr2.

The first switching unit Tr1 included in each of the stages ST1 to STn and dummy stages responds to the scan pulse from the previous stage, and supplies the charging voltage source VDD to the node n of the current stage. In more detail, the first switching unit Tr1 included in the node controller NC of the 'k'th stage responds to the 'k−2'th scan pulse output from the 'k−2'th stage, and supplies the charging voltage source VDD to the node n of the 'k'th stage. For this, the first switching unit Tr1 of the 'k'th stage includes the gate terminal connected to the output terminal 340 of the 'k−2'th stage, the drain terminal connected to the charging voltage source transmission line, and the source terminal connected to the node n of the 'k'th stage. For example, the first switching unit Tr1 included in the third stage ST3 charges the node n of the third stage ST3 by the charging voltage source VDD in response to the first scan pulse Vout1 from the first stage ST1.

The second switching unit Tr2 included in each of the stages ST1 to STn and dummy stages responds to the scan pulse from the next stage, and supplies the clock pulse to the node n of the current stage. In more detail, the second switching unit Tr2 included in the node controller NC of the 'k'th stage responds to the 'k+2'th scan pulse from the 'k+2'th stage, and supplies the clock pulse to the node n of the 'k'th stage. For this, the second switching unit Tr2 included in the 'k'th stage includes the gate terminal connected to the output terminal 340 of the 'k+2'th stage; the source terminal connected to the clock pulse transmission line; and the drain terminal connected to the node n of the 'k'th stage.

The clock pulse supplied to the drain terminal of the second switching unit Tr2 included in the 'k'th stage is identical to the clock pulse supplied to the drain terminal of the pull-up switch Trpu included in the 'k'th stage.

The scan pulse supplied to the gate terminal of the second switching unit Tr2 included in the 'k'th stage is synchronized with the clock pulse supplied to the gate terminal of the first pull-down switch Trpd1 included in the 'k'th stage. Accordingly, the first pull-down switch Trpd1 and the second switching unit Tr2 included in the 'k'th stage are turned-on at the same time.

The second switching unit Tr2 corresponds to the switching unit for discharging the node n. The second switching unit Tr2 discharges the node n by using the clock pulse instead of the related art discharging voltage source VSS.

The clock pulse is synchronized with the period of turning-on the second switching unit Tr2, whereby the clock pulse is maintained as a non-active state, that is, low state. Meanwhile, the clock pulse is maintained as a high state at a following period (output period of the stage) just after the pull-up switch Trpu is turned-on. Thus, the stages ST1 to STn and dummy stages can output the scan pulse for the output period by using the pull-up switch Trpu and the clock pulse of high state, and also discharge the node n for the disable period by using the second switching unit Tr2 and the clock pulse of low state. For example, the second switching unit Tr2 included in the third stage ST3 discharges the node n of the third stage ST3 by the third clock pulse CLK3 of low state in response to the fifth scan pulse Vout5 from the fifth stage ST5. As shown in FIG. 3, the third clock pulse CLK3 is maintained as the low state for the period of outputting the fifth scan pulse Vout5.

Figure 5:
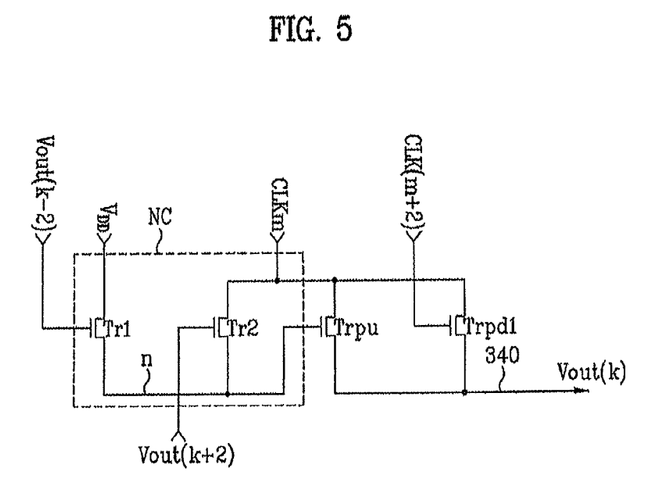
FIG. 5 is a diagram illustrating a second circuit structure of stage of FIG. 2.

FIG. 5 is a diagram illustrating a second circuit structure of stage of FIG. 2. The second circuit structure of FIG. 5 is similar to the first circuit structure of FIG. 4. In case of the second circuit structure of FIG. 5, the drain terminal of the first pull-down switch Trpd1 is connected to the clock transmission line instead of the discharging voltage source transmission line.

At this time, the drain terminal of the first pull-down switch Trpd1, the drain terminal of the pull-up switch Trpu, and the drain terminal of the second switching unit Tr2 are connected to the same clock transmission line, and are also supplied with the same clock pulse. For example, the third clock pulse CLK3 is supplied to the drain terminal of the first pull-down switch Trpd1, the drain terminal of the second switching unit Tr2 and the drain terminal of the pull-up switch Trpu included in the third stage ST3.

In the second circuit structure, the first pull-down switch Trpd1 discharges the output terminal 340 at the disable period of discharging the node n according as the second switching unit Tr2 is turned-on. At this time, the second switching unit Tr2 discharges the output terminal 340 by using the clock pulse of low state instead of the discharging voltage source VSS.

In case of the second circuit structure of FIG. 5, the discharging voltage source VSS is not used in the output unit (including the pull-up switch Trpu and first pull-down switch Trpd1) as well as the node controller NC. This second circuit structure of FIG. 5 can reduce the load on the discharging voltage source transmission line as compared with that of the first circuit structure.

Figure 6:
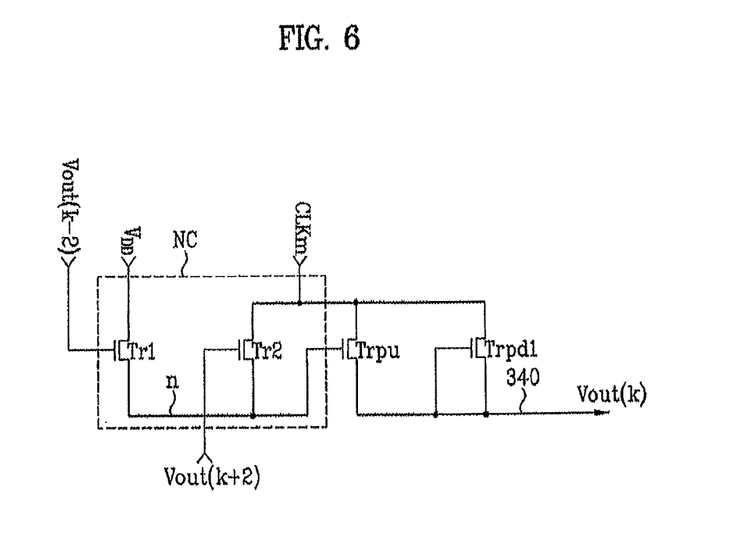
FIG. 6 is a diagram illustrating a third circuit structure of stage of FIG. 2.

FIG. 6 is a diagram illustrating a third circuit structure of stage of FIG. 2. The third circuit structure of FIG. 6 is similar to the first circuit structure of FIG. 4. In case of the third circuit structure of FIG. 6, the drain terminal of the first pull-down switch Trpd1 is connected to the clock transmission line instead of the discharging voltage source transmission line, and the gate terminal of the first pull-down switch Trpd1 is connected to the output terminal 340 instead of the clock transmission line. At this time, the drain terminal of the first pull-down switch Trpd1, the drain terminal of the pull-up switch Trpu, and the drain terminal of the second switching unit Tr2 are connected to the same clock transmission line, and are also supplied with the same clock pulse.

The first pull-down switch Trpd1 is maintained in the turning-off state at a moment of supplying the clock pulse of high state to the output terminal 340 according as the pull-up switch Trpu is turned-on, whereby it has no effect on the output period of stage. That is, if the clock pulse of high state is supplied to the output terminal 340, the pull-down switch Trpd functions as an inverted-direction diode. However, the first pull-down switch Trpd1 is turned-on when the clock pulse of low state supplied to the drain terminal of the first pull-down switch Trpd falls to the low state. The first pull-down switch Trpd1 being turned-on supplies the clock pulse of low state to the output terminal 340, thereby discharging the output terminal 340.

Figure 7:
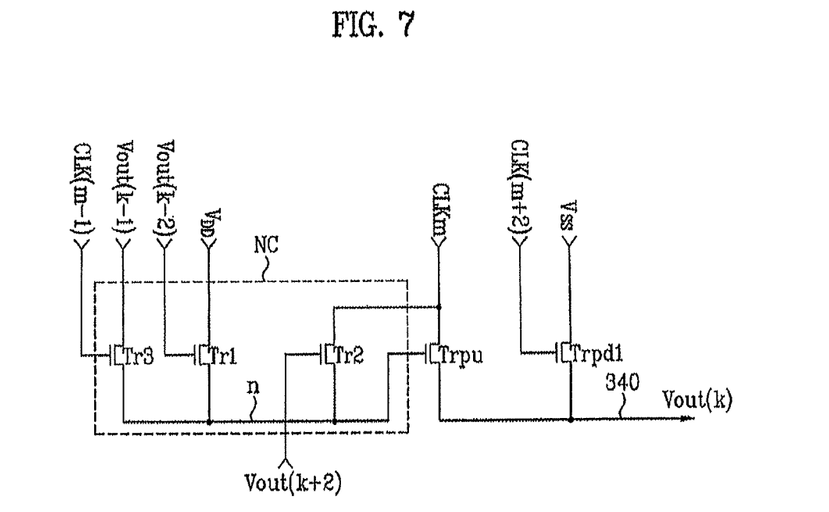
FIG. 7 is a diagram illustrating a fourth circuit structure of stage of FIG. 2.

FIG. 7 is a diagram illustrating a fourth circuit structure of stage of FIG. 2. The fourth circuit structure of FIG. 7 is similar to the first circuit structure of FIG. 4. The node controller NC included in the fourth circuit structure of FIG. 7 additionally includes a third switching unit Tr3 as well as the first and second switching units Tr1 and Tr2 included in the first circuit structure of FIG. 4.

Each of the stages ST1 to STn and dummy stages includes the third switching unit Tr3, wherein the third switching unit Tr3 included in each of the stages ST1 to STn and dummy stages supplies the scan pulse from the previous stage to the node n of the current stage in response to the clock pulse. In more detail, the third switching unit Tr3 included in the node controller NC of the 'k'th stage supplies the 'k−1'th scan pulse from the 'k−1'th stage to the node n of the 'k'th stage in response to the clock pulse. For this, the third switching unit Tr3 included in the 'k'th stage includes the gate terminal connected to the clock transmission line, the drain terminal connected to the output terminal 340 of the 'k−1'th stage, and the source terminal connected to the node n of the 'k'th stage. For example, the third switching unit Tr3 included in the third stage ST3 charges the node n of the third stage ST3 by the second scan pulse Vout2 in response to the second clock pulse CLK2.

In the meantime, the third switching unit Tr3 included in the node controller NC of the 'k'th stage may supply the 'k−2'th scan pulse from the 'k−2'th stage to the node n of the 'k'th stage in response to the clock pulse. For this, the gate terminal of the second switching unit Tr2 included in the 'k'th stage is connected to the clock transmission line; the drain terminal thereof is connected to the output terminal 340 of the 'k−2'th stage; and the source terminal thereof is connected to the node n of the 'k'th stage. For example, the third switching unit Tr3 included in the third stage ST3 charges the node n of the third stage ST3 by the first scan pulse Vout1 in response to the first clock pulse CLK1. In this case, the clock pulse supplied to the gate terminal of the third switching unit Tr3 included in the 'k'th stage is synchronized with the scan pulse supplied to the gate terminal of the first switching unit Tr1 included in the 'k'th stage. Accordingly, the first switching unit Tr1 and the third switching unit Tr3 included in the 'k'th stage are turned-on at the same time.

Figure 8:
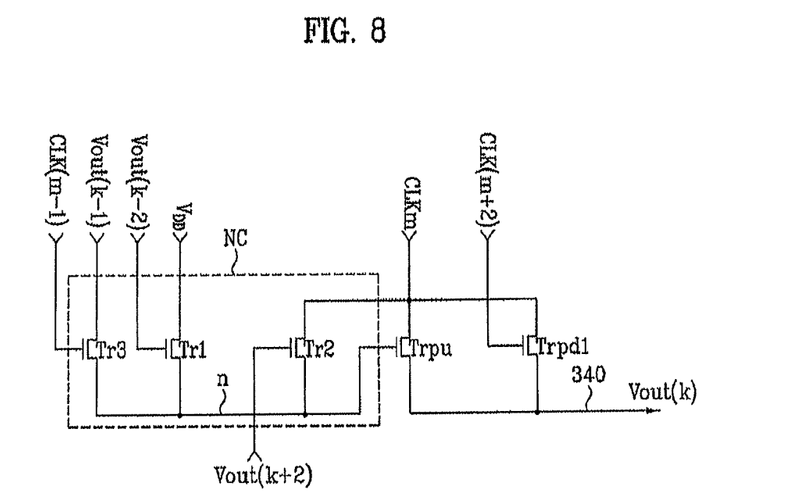
FIG. 8 is a diagram illustrating a fifth circuit structure of stage of FIG. 2.

FIG. 8 is a diagram illustrating a fifth circuit structure of stage of FIG. 2. The fifth circuit structure of FIG. 8 is similar to the second circuit structure of FIG. 5. However, the node controller NC of the fifth circuit structure of FIG. 8 additionally includes a third switching unit Tr3 as well as the first and second switching units Tr1 and Tr2 included in the second circuit structure of FIG. 5. The third switching unit Tr3 of FIG. 8 is identical to the aforementioned third switching unit Tr3 of FIG. 7, whereby the detailed explanation for the third switching unit Tr3 is omitted.

Figure 9:
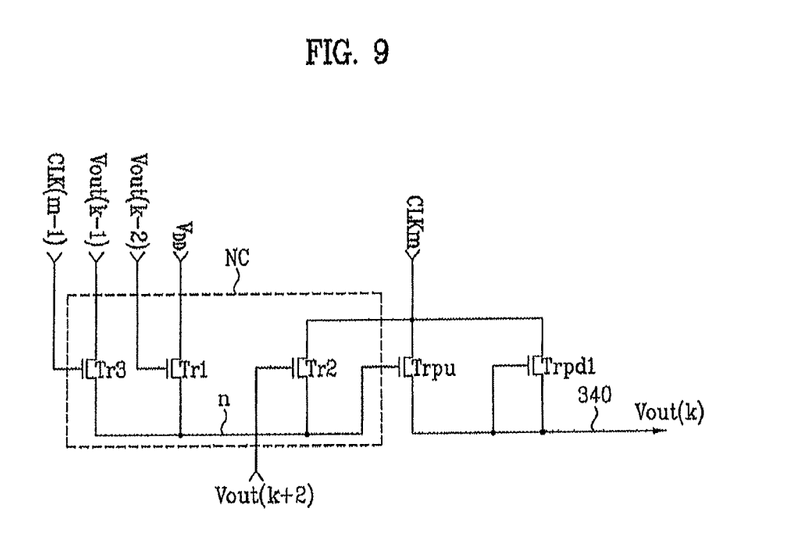
FIG. 9 is a diagram illustrating a sixth circuit structure of stage of FIG. 2.

FIG. 9 is a diagram illustrating a sixth circuit structure of stage of FIG. 2. The sixth circuit structure of FIG. 9 is similar to the third circuit structure of FIG. 6. However, the node controller NC included in the sixth circuit structure of FIG. 9 additionally includes a third switching unit Tr3 as well as the first and second switching units Tr1 and Tr2 included in the third circuit structure of FIG. 6.

Figure 10:
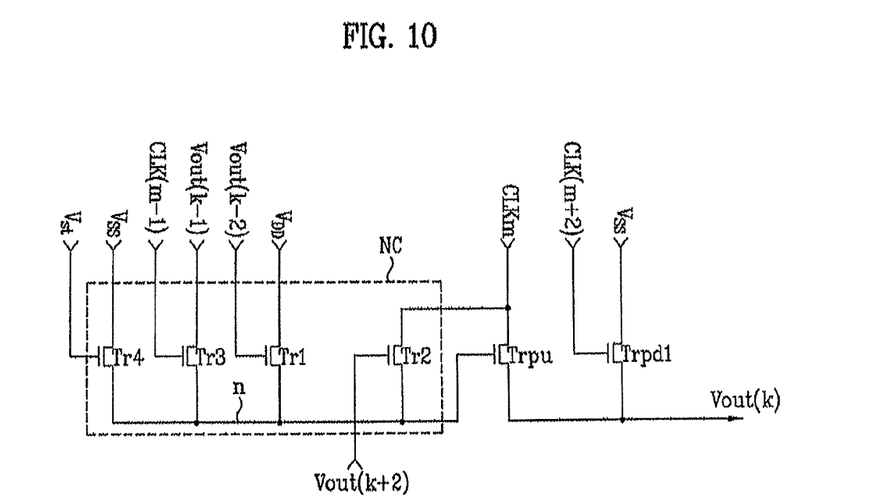
FIG. 10 is a diagram illustrating a seventh circuit structure of stage of FIG. 2.

FIG. 10 is a diagram illustrating a seventh circuit structure of stage of FIG. 2. The seventh circuit structure of FIG. 10 is similar to the fourth circuit structure of FIG. 7. However, the node controller NC included in the seventh circuit structure of FIG. 10 additionally includes a fourth switching unit Tr4 as well as the first to third switching units Tr1 to Tr3 included in the fourth circuit structure of FIG. 7.

Each of the stages ST1 to STn and dummy stages includes the fourth switching unit Tr4, wherein the fourth switching unit included in each of the stages ST1 to STn and dummy stages supplies the discharging voltage source VSS to the node n of the current stage. In more detail, the fourth switching unit Tr4 included in the node controller NC of the 'k'th stage supplies the discharging voltage source VSS to the node n of the 'k'th stage in response to the start pulse Vst. For this, the gate terminal of the fourth switching unit Tr4 included in the 'k'th stage is connected to the start pulse transmission line for transmitting the start pulse; the drain terminal thereof is connected to the node n of the 'k'th stage; and the source terminal is connected to the discharging voltage source transmission line.

The fourth switching unit Tr4 may be included in each for all the stages, or may be included in each for the other stages except the stages being enabled by the start pulse. That is, the fourth switching unit Tr4 is not formed in each of the first and second stages ST1 and ST2 enabled by the start pulse Vst.

If the fourth switching unit Tr4 is provided in each for all the stages, the drain terminal of the fourth switching unit Tr4 included in the stages enabled by the start pulse Vst is supplied with the following control signal instead of the discharging voltage source VSS. The control signal is maintained as the active state (that is, high state) for the period of turning-on the fourth switching unit Tr4, and is maintained as the non-active state (that is, low state) for the period of turning-off the fourth switching unit Tr4. The control signal may be provided in an inverted shape at an angle of 180° with respect to the start pulse Vst.

The stages including the fourth switching unit Tr4 among the other stages except the stage enabled by the start pulse Vst are disabled at the same time in response to the start pulse Vst. For example, the fourth switching unit Tr4 included in the third stage ST3 discharges the node n of the third stage ST3 by the discharging voltage source VSS in response to the start pulse Vst.

Figure 11:
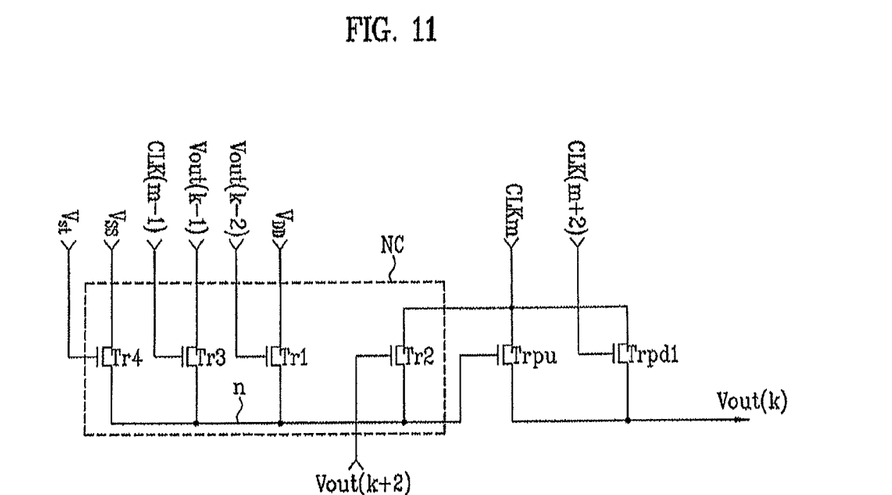
FIG. 11 is a diagram illustrating an eighth circuit structure of stage of FIG. 2.

FIG. 11 is a diagram illustrating an eighth circuit structure of stage of FIG. 2. The eighth circuit structure of FIG. 11 is similar to the fifth circuit structure of FIG. 8. However, the node controller NC included in the eighth circuit structure of FIG. 11 additionally includes a fourth switching unit Tr4 as well as the first to third switching units Tr1 to Tr3 included in the fifth circuit structure of FIG. 8. The fourth switching unit Tr4 of FIG. 11 is identical to the fourth switching unit Tr4 of FIG. 10, whereby the detailed explanation for the fourth switching unit Tr4 is omitted.

Figure 12:
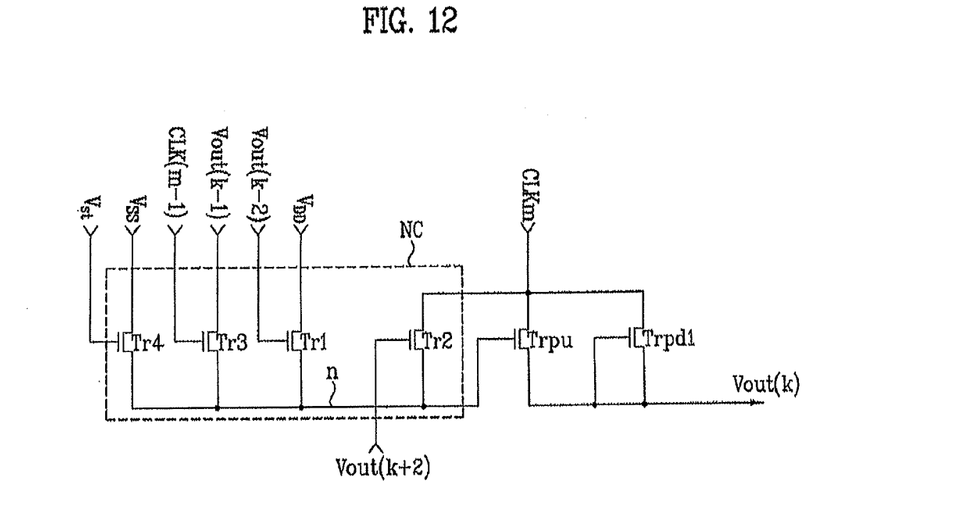
FIG. 12 is a diagram illustrating a ninth circuit structure of stage of FIG. 2.

FIG. 12 is a diagram illustrating a ninth circuit structure of stage of FIG. 2. The ninth circuit structure of FIG. 12 is similar to the sixth circuit structure of FIG. 10. However, the node controller NC included in the ninth circuit structure of FIG. 12 additionally includes a fourth switching unit Tr4 as well as the first to third switching units Tr1 to Tr3 included in the sixth circuit structure of FIG. 10. The fourth switching unit Tr4 of FIG. 12 is identical to the fourth switching unit Tr4 of FIG. 10, whereby the detailed explanation for the fourth switching unit Tr4 is omitted.

Figure 13:
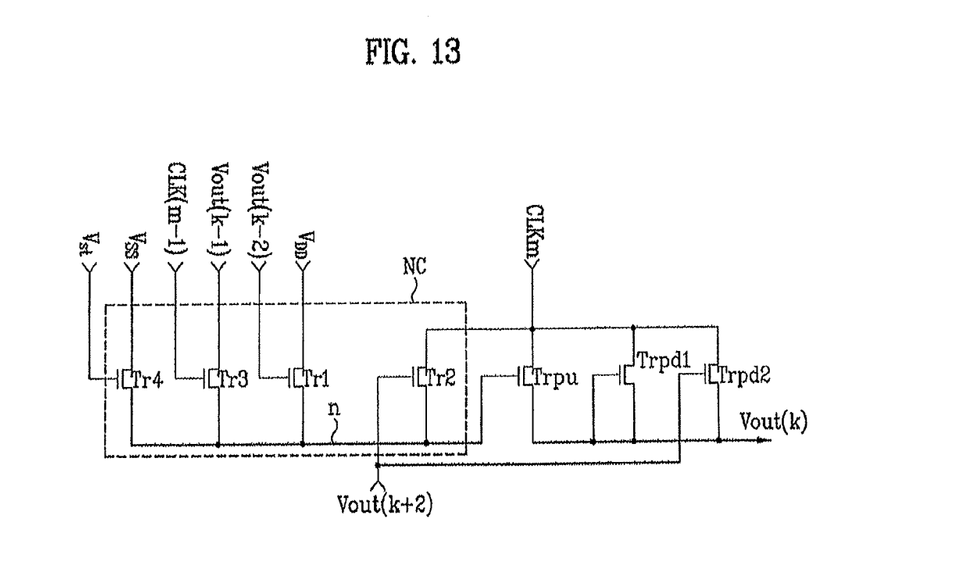
FIG. 13 is a diagram illustrating a tenth circuit structure of stage of FIG. 2.

FIG. 13 is a diagram illustrating a tenth circuit structure of stage of FIG. 2. The tenth circuit structure of FIG. 13 is similar to the ninth circuit structure of FIG. 12. However, the node controller NC included in the tenth circuit structure of FIG. 13 additionally includes a second pull-down switch Trpd2 as well as the first pull-down switch Trpd1 included in the ninth circuit structure of FIG. 10.

The second pull-down switch Trpd2 is included in each of the stages ST1 to STn and dummy stages. The second pull-down switch Trpd2 included in the current stage outputs the clock pulse of low state in response to the scan pulse from the next stage, and supplies the clock pulse of low state to the corresponding gate line, the previous stage and the next stage through the output terminal 340. In more detail, the second pull-down switch Trpd2 included in the 'k'th stage outputs the clock pulse of low state in response to the 'k+2'th scan pulse from the 'k+2'th stage, and supplies the clock pulse of low state to the 'k'th gate line, the 'k+2'th stage and the 'k−2'th stage. For this, the gate terminal of the second pull-down switch Trpd2 is connected to the output terminal 340 of the 'k+2'th stage; the drain terminal thereof is connected to the clock transmission line; and the source terminal thereof is connected to the output terminal 340 of the 'k'th stage. At this time, the output terminal 340 of the 'k'th stage is connected to the 'k'th gate line, the 'k+2'th stage and the 'k−2'th stage.

At this time, the drain terminal of the second switching unit Tr2, the drain terminal of the pull-up switch Trpu, the drain terminal of the first pull-down switch Trpd1, and the drain terminal of the second pull-down switch Trpd2 are connected to the same clock transmission line, and are also supplied with the same clock pulse. For example, the drain terminal of the second switching unit Tr2, the drain terminal of the pull-up switch Trpu, the drain terminal of the first pull-down switch Trpd1, and the drain terminal of the second pull-down switch Trpd2 included in the third stage ST3 are supplied with the third clock pulse CLK3.

The second pull-down switch Trpd2 included in the tenth circuit structure discharges the output terminal 340 for the disable period of discharging the node n according as the second switching unit Tr2 is turned-on. At this time, the second pull-down switch Trpd2 discharges the output terminal 340 by using the clock pulse of low state instead of using the discharging voltage source VSS.

In each of the circuit structures, the first switching unit Tr1 of the current stage is turned-on by the scan pulse from the previous stage, to thereby supply the scan pulse from the previous stage to the node n. For example, the first switching unit Tr1 included in the 'k'th stage is turned-on by the 'k−2'th scan pulse from the 'k−2'th stage, so that the 'k−2'th scan pulse is supplied to the node n, thereby charging the node n. Also, the 'k'th stage is enabled by the 'k−1'th scan pulse from the 'k−1'th stage, instead of the 'k−2'th scan pulse from the 'k−2'th stage. In this case, the gate terminal of the first switching unit Tr1 included in the 'k'th stage is supplied with the 'k−1'th scan pulse from the 'k−1'th stage.

In FIGS. 4, 5, 7, 8, 10 and 11, the kind of clock pulse supplied to the gate terminal of the first pull-down switch Trpd1 varies in synchronization with the scan pulse based on which stage outputs the scan pulse supplied to the gate terminal of the second switching unit Tr2. For example, if the gate terminal of the second switching unit Tr2 included in the third stage ST3 of FIG. 4 is supplied with the fourth scan pulse Vout4 from the fourth stage ST4, the gate terminal of the first pull-down switch Trpd1 is supplied with the fourth clock pulse CLK4 synchronized with the fourth scan pulse Vout4.

An operation of the shift register according to the present invention will be explained as follows.

Figure 14:
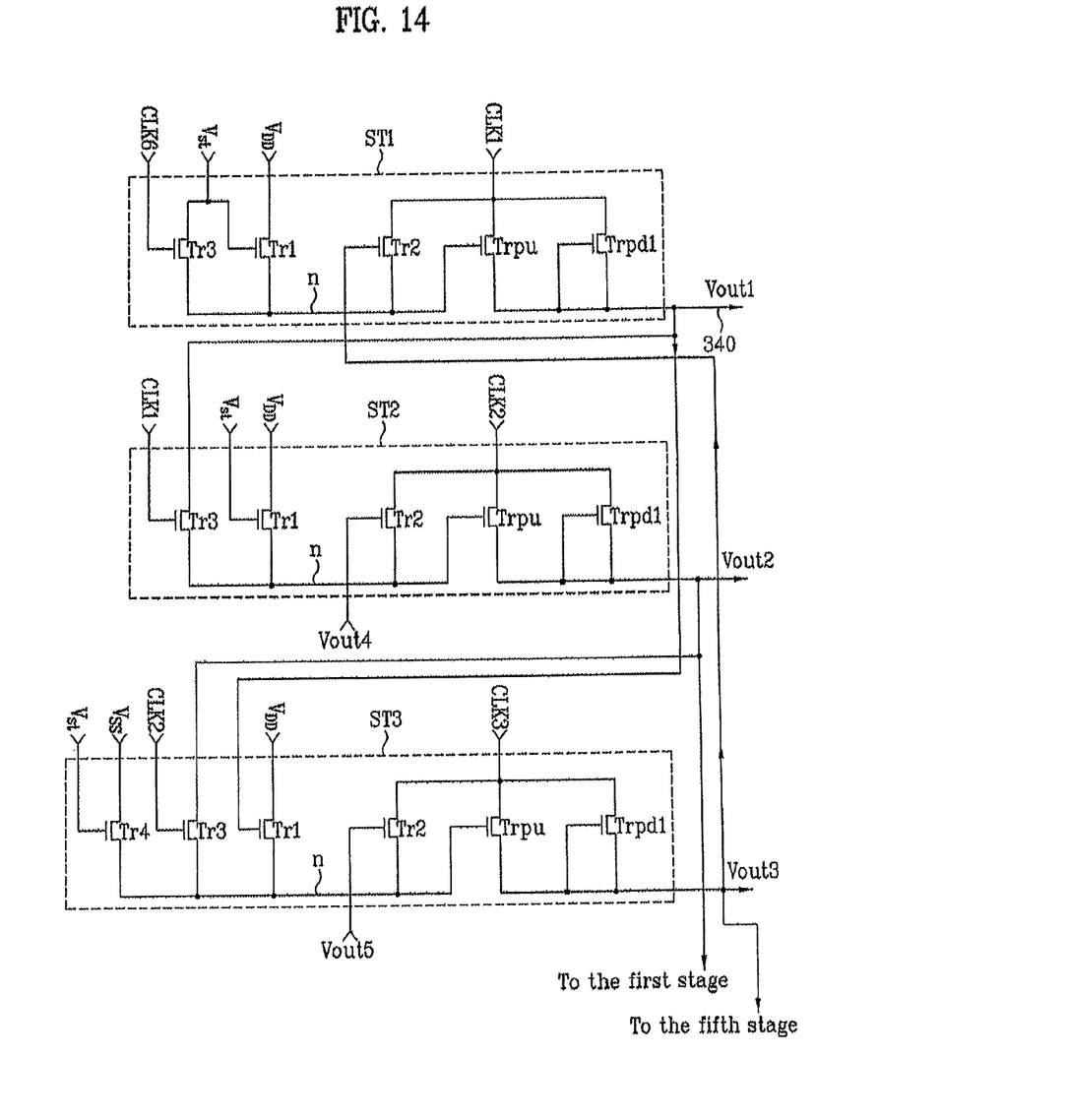
FIG. 14 is a diagram illustrating a circuit structure of first to third stages of FIG. 2.

FIG. 14 is a diagram illustrating a circuit structure of first to third stages of FIG. 2. At this time, the first to third stages of FIG. 14 include the ninth circuit structure of FIG. 12. The first and second stages ST1 and ST2 of FIG. 14 are enabled by the start pulse Vst, wherein the first and second stages ST1 and ST2 has the circuit structure from which the fourth switching unit Tr4 is removed. Also, the third stage ST3 includes the fourth switching unit Tr4.

First, an initial period T0 will be explained as follows. For the initial period T0, as shown in FIG. 3, only start pulse Vst is maintained as the high state, and the first to sixth clock pulses CLK1 to CLK6 are maintained as the low state. The start pulse Vst is input to all stages including the first to third stages ST1 to ST3.

In detail, the start pulse Vst is supplied to the drain terminal of the third switching unit Tr3 and the gate terminal of the first switching unit Tr1 included in the first stage ST1. Then, the first switching unit Tr1 of the first stage ST1 is turned-on. Through the first switching unit Tr1 being turned-on, the start pulse Vst of high state is supplied to the node n of the first stage ST1. Accordingly, the node n of the first stage ST1 is charged by the start pulse Vst of high state, and the pull-up switch Trpu whose gate terminal is connected to the charged node n is turned-on. Meanwhile, there is no output from the third stage ST3 for the initial period T0, whereby the second switching unit Tr2 of the first stage ST1 is turned-off.

An operation of the second stage ST2 for the initial period T0 will be explained as follows. The start pulse Vst is supplied to the second stage. In detail, the start pulse Vst is supplied to the gate terminal of the first switching unit Tr1 included in the second stage. Thus, the first switching unit Tr1 is turned-on. Through the turned-on first switching unit Tr1, the charging voltage source VDD is supplied to the node n of the second stage ST2. Accordingly, the node n is charged by the charging voltage source VDD, and the pull-up switch Trpu whose gate terminal is connected to the charged node n is turned-on.

An operation of the third stage ST3 for the initial period T0 will be explained as follows. The start pulse Vst of high state output for the initial period T0 is supplied to the gate terminal of the fourth switching unit Tr4 included in the third stage ST3. Then, the fourth switching unit Tr4 of the third stage ST3 is turned-on. Through the turned-on fourth switching unit Tr4, the discharging voltage source VSS is supplied to the node n of the third stage ST3. Accordingly, the node n of the third stage ST3 is discharged by the discharging voltage source VSS, and the pull-up switching unit Trpu whose gate terminal is connected to the discharged node n is turned-off. Meanwhile, there is no output from the fifth stage ST5 for the initial period T0, whereby the second switching unit Tr2 of the fifth stage ST5 is turned-off. For the initial period T0, the fourth to 'n'th stages ST4 to STn and the dummy stages are operated in the same mode as that of the third stage ST3.

A first period T1 will be explained as follows.

For the first period T1, as shown in FIG. 3, the start pulse Vst and the first clock pulse CLK1 are maintained as the high state, and the second to sixth clock pulses CLK2 to CLK6 are maintained as the low state. Accordingly, the other stages as well as the first to third stages ST1 to ST3 and the dummy stages repeat once the operation for the initial period T0 by the start pulse Vst of high state, and the following operation is performed by the first clock pulse CLK1 of the high state. That is, since the start pulse Vst is maintained as the high state for the first period T1, the first switching unit Tr1 included in the first stage ST1 is turned-on. Thus, the node n of the first stage ST1 is charged for the first period T1. As a result, the pull-up switch Trpu whose gate terminal is connected to the charged node n is also turned-on.

As the first clock pulse CLK1 of high state is supplied to the drain terminal of the first pull-up switch Trpu being turned-on, the pull-up switch Trpu outputs the first clock pulse CLK1 of high state as the first scan pulse Vout1 for the first period T1, and supplies the first scan pulse Vout1 to the first gate line, the second stage ST2 and the third stage ST3 through the output terminal 340. According as the first clock pulse CLK1 of the high state is supplied to the output terminal 340 of the first stage ST1, the first clock pulse CLK1 of high state is supplied to the gate terminal, the drain terminal and the source terminal included in the first pull-down switch Trpd1. As a result, the first pull-down switch Trpd1 is maintained in the turning-off state.

The first scan pulse Vout1 is supplied to the drain terminal of the third switching unit Tr3 included in the second stage ST2. Also, the first clock pulse CLK1 of the high state is supplied to the gate terminal of the third switching unit Tr3 included in the second stage ST2. Accordingly, the third switching unit Tr3 is turned-on. Then, the first scan pulse Vout1 of the high state is supplied to the node n of the second stage ST2 through the third switching unit Tr3 being turned-on. Accordingly, the pull-up switch Trpu of the second stage ST2 whose gate terminal is connected to the charged node n is turned-on.

Also, the first scan pulse Vout1 is supplied to the gate terminal of the first switching unit Tr1 included in the third stage ST3. Then, the first switching unit Tr1 of the third stage ST1 is turned-on. Accordingly, the charging voltage source VDD is supplied to the node n of the third stage ST3 through the first switching unit Tr1 being turned-on. Even though the discharging voltage source VSS is supplied to the node n of the third stage ST3 through the turned-on fourth switching unit Tr4 for the first period, the node n of the third stage is maintained in the charged state by the charging voltage source VDD. Accordingly, the pull-up switch Trpu whose gate terminal is connected to the charged node n is turned-on.

Meanwhile, since the second to sixth clock pulses CLK2 to CLK6 are in the low state for the first period T1, there is no output from the other stages. In brief, for the first period T1, the first stage ST1 outputs the first scan pulse Vout1, and the second and third stages ST2 and ST3 are enabled.

An operation for a second period T2 will be explained as follows.

For the second period T2, as shown in FIG. 3, the first and second clock pulses CLK1 and CLK2 are maintained as the high state, and the start pulse and the third to sixth clock pulses CLK3 to CLK6 are maintained as the low state. In response to the start pulse Vst of the low state, the first switching unit Tr1 of the first stage ST1 is turned-off. In response to the sixth clock pulse CLK6 of the low state, the third switching unit Tr3 of the first stage ST1 is turned-off.

According as the first and third switching unit Tr1 and Tr3 are turned-off, the node n of the first stage ST1 is maintained as a floating state. Thus, the node n of the first stage ST1 is maintained as the charged state by the charging voltage source VDD applied for the initial period T0. As a result, the pull-up switch Trpu of the first stage ST1 whose gate terminal is connected to the node n is maintained in the turning-on state. At this time, the first clock pulse CLK1 is supplied to the pull-up switch Trpu being turned-on. Then, the charging voltage source VDD charged in the node n of the first stage ST1 is amplified (bootstrapping).

Accordingly, the first clock pulse CLK1 supplied to the drain terminal of the pull-up switch Trpu included in the first stage ST1 is stably output through the source terminal of the pull-up switch Trpu. The first clock pulse CLK1 output from the pull-up switch Trpu corresponds to the first scan pulse Vout1. For the second period T2, the first stage ST1 outputs the first scan pulse Vout1 which is maintained as a perfect target voltage.

Also, the second clock pulse CLK2 maintained as the high state for the second period T2 is supplied to the second stage ST2. That is, the second clock pulse CLK2 is supplied to the drain terminal of the second switching unit Tr2, the drain terminal of the pull-up switch Trpd1, and the drain terminal of the first pull-down switch Trpd1 included in the second stage ST2. The second clock pulse CLK2 supplied to the second stage ST2 is output to the output terminal 340 of the second stage ST2 through the pull-up switch Trpu being turned-on.

The second clock pulse CLK2 output through the pull-up switch Trpu corresponds to the second scan pulse Vout2. This second scan pulse Vout2 is supplied to the second gate line, the third stage ST3 and the fourth stage ST4. The second scan pulse Vout2 supplied to the third stage ST3 enables the third stage, and the second scan pulse Vout2 supplied to the fourth stage ST4 enables the fourth stage ST4. In brief, the first stage ST1 outputs the first scan pulse Vout1 which reaches the perfect target voltage for the second period T2; the second stage ST2 starts to output the second scan pulse Vout2; and the third and fourth stages ST3 and ST4 are enabled.

An operation for a third period T3 will be explained as follows.

For the third period T3, as shown in FIG. 3, the second and third clock pulses CLK2 and CLK3 are maintained as the high state. Meanwhile, the start pulse Vst, the first clock pulse CLK1, and the fourth to sixth clock pulses CLK4 to CLK6 are maintained as the low state. For the third period T3, the second stage ST2 outputs the second scan pulse Vout2 which reaches the perfect target voltage; the third stage ST3 starts to output the third scan pulse Vout3; and the fourth and fifth stages ST4 and ST5 are enabled. Also, for the third period T3, the third scan pulse Vout3 output from the third stage ST3 is supplied to the first stage ST1, whereby the first stage ST1 is disabled.

This disable operation will be explained in detail as follows.

That is, the third scan pulse Vout3 from the third stage ST3 is supplied to the gate terminal of the second switching unit Tr2 included in the first stage ST1. Accordingly, the second switching unit Tr2 is turned-on. Through the second switching unit Tr2 being turned-on, the first clock pulse CLK1 of the low state is supplied to the node n of the first stage ST1. Thus, the node n of the first stage ST1 is discharged by the first clock pulse CLK1 of the low state.

For the third period T3, the first pull-down switch Trpd1 included in the first stage ST1 is turned-on since the first clock pulse CLK1 of the low state is supplied to the drain terminal of the first pull-down switch Trpd1. The first pull-down switch Trpd1 being turned-on supplies the first clock pulse CLK1 of the low state to the output terminal 340 of the first stage ST1, so that it is possible to prevent the leakage of voltage in the first gate line for the non-output period of the first stage ST1

In this same method, the second stage ST2 discharges its node n by using the second clock pulse CLK2 of the low state in response to the fourth scan pulse Vout4 from the fourth stage ST4. The other stages discharge their nodes n by the clock pulse for the non-output period, according to the same method aforementioned.

Figure 15:
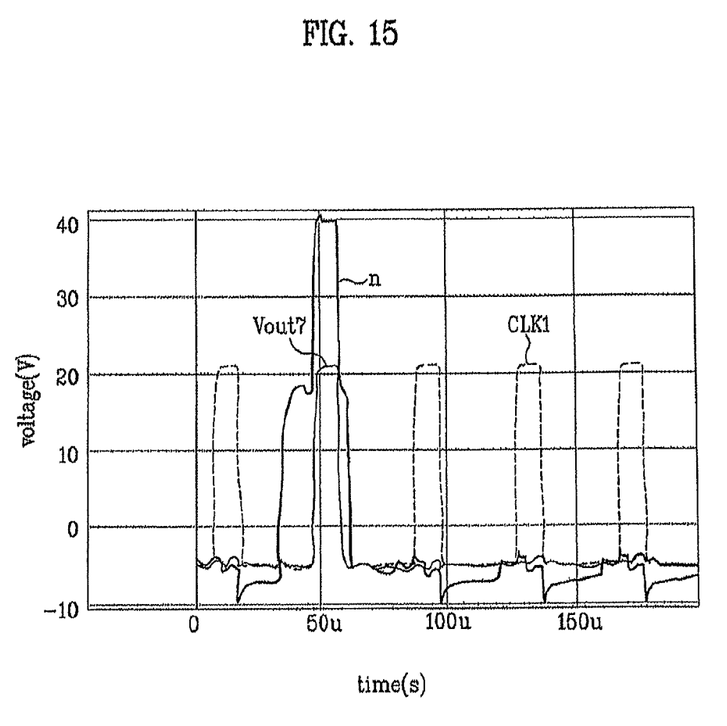
FIG. 15 is a waveform diagram illustrating a scan pulse from a seventh stage included in a shift register having a circuit structure of FIG. 14.

FIG. 15 is a waveform diagram illustrating a scan pulse from a seventh stage included in a shift register having a circuit structure of FIG. 14. As shown in FIG. 15, the voltages of node and scan pulse are stably output.

As mentioned above, the shift register according to the present invention has the following advantages.

First, the node is discharged by using the clock pulse instead of the discharging voltage source, so that it is possible to decrease the load on the discharging voltage source transmission line.

According as the nodes and switching devices are decreased in number, the stage is also decreased in size.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A shift register comprising a plurality of stages to sequentially output scan pulses through respective output terminals, wherein each of the stages comprises:
   a pull-up switching unit controlled based on a signal state of a node, and connected between an output terminal and any one among a plurality of clock transmission lines to transmit clock pulses provided with sequential phase differences; and
   a node controller to control the signal state of the node, and to discharge the node by using a clock pulse from a clock transmission line;
   wherein the node controller of the current stage comprises:
   a first switching unit controlled by a start pulse or a scan pulse from a previous stage and connected between the node and a charging voltage source transmission line to transmit a charging voltage source;
   a second switching unit controlled by the scan pulse from a subsequent stage and connected between the node and any one among the plurality of clock transmission lines, and
   a third switching unit which is controlled by the clock pulse from any one among the plurality of clock transmission lines and is connected between the node and an output terminal of a previous stage, and the clock pulse supplied to the third switching unit and the scan pulse supplied to the output terminal of the previous stage have the same phase,
   wherein the second switching unit is turned-on for a non-active state of the clock pulse of the clock transmission line connected to the second switching unit, and the second switching unit and the pull-up switching unit are connected to the same clock transmission line;
   wherein the first switching unit included in the node controller of the 'n'th stage is controlled by the scan pulse from the 'n−1'th stage or the scan pulse from the 'n−2'th stage; and the second switching unit included in the node controller of the 'n'th stage is controlled by the scan pulse from the 'n+2'th stage or the scan pulse from the 'n+3'th stage.

2. The shift register of claim 1, wherein the current stage further includes a first pull-down switch which is controlled by the clock pulse from any one among the plurality of clock transmission lines, and is connected between the output terminal and a discharging voltage source transmission line to transmit the discharging voltage source, and the first pull-down switch and the second switching unit are turned-on at the same period.

3. The shift register of claim 1, wherein the node controller of the current stage further includes a fourth switching unit which is controlled by a first control signal having an active state once for one frame period, and is connected between the node and a discharging voltage source transmission line to transmit the discharging voltage source.

4. The shift register of claim 3, wherein the first control signal corresponds to a start pulse.

5. The shift register of claim 3, wherein the first control signal corresponds to a start pulse, and any one of the clock pulses is synchronized with the start pulse.

6. The shift register of claim 1, wherein the node controller provided for each of the other stages except the stage enabled by the start pulse includes a fourth switching which is controlled by a first control signal having the active state once for one frame period, and is connected between the node and a charging voltage source line.

* * * * *